United States Patent
Kwong et al.

(10) Patent No.: US 7,281,326 B1
(45) Date of Patent: *Oct. 16, 2007

(54) TECHNIQUE FOR ROUTING CONDUCTIVE TRACES BETWEEN A PLURALITY OF ELECTRONIC COMPONENTS OF A MULTILAYER SIGNAL ROUTING DEVICE

(75) Inventors: Herman Kwong, Kanata (CA); Aneta Wyrzykowska, Dunrobin (CA); Kah Ming Soh, Kanata (CA); Eileen Goulet, Gatineau (CA); Luigi Difilippo, Kanata (CA); Larry Marcanti, Allen, TX (US)

(73) Assignee: Nortel Network Limited, Quebec (CA)

( * ) Notice: Subject to any disclaimer, the term of this patent is extended or adjusted under 35 U.S.C. 154(b) by 410 days.

This patent is subject to a terminal disclaimer.

(21) Appl. No.: 10/728,881

(22) Filed: Dec. 8, 2003

Related U.S. Application Data (63) Continuation-in-part of application No. 10/101,211, filed on Mar. 20, 2002, which is a continuation-in-part of application No. 09/651,188, filed on Aug. 30, 2000, now Pat. No. 6,388,890, which is a continuation-in-part of application No. 10/101,211, filed on Mar. 20, 2002, which is a continuation-in-part of application No. 10/126,700, filed on Apr. 22, 2002, now Pat. No. 6,545,876, which is a continuation-in-part of application No. 10/326,123, filed on Dec. 23, 2002, now Pat. No. 7,069,650, which is a continuation-in-part of application No. 09/651,188, filed on Aug. 30, 2000, now Pat. No. 6,388,890, which is a continuation-in-part of application No. 10/101,211, filed on Mar. 20, 2002, which is a continuation-in-part of application No. 10/126,700, filed on Apr. 22, 2002, now Pat. No. 6,545,876, which is a continuation-in-part of application No. 10/326,079, filed on Dec. 23, 2002, now Pat. No. 7,069,650, which is a continuation-in-part of application No. 10/126,700, filed on Apr. 22, 2002, now Pat. No. 6,545,876, which is a continuation-in-part of application No. 10/407,460, filed on Apr. 7, 2003, now Pat. No. 7,069,646, which is a continuation-in-part of application No. 10/101,211, filed on Mar. 20, 2002, which is a continuation-in-part of application No. 10/326,123, filed on Dec. 23, 2002, now Pat. No. 7,069,650, which is a continuation-in-part of application No. 10/326,079, filed on Dec. 23, 2002.

(60) Provisional application No. 60/212,387, filed on Jun. 19, 2000.

(51) Int. Cl.
*H01K 3/10* (2006.01)

(52) U.S. Cl. .......................... 29/852; 29/825; 29/846; 174/255; 174/262; 333/243; 333/161; 333/246; 333/1

(58) Field of Classification Search ................ 29/825, 29/846, 852; 174/255, 262; 333/243, 1, 333/161, 246
See application file for complete search history.

(56) References Cited

U.S. PATENT DOCUMENTS

| | | | |
|---|---|---|---|
| 5,006,820 A | 4/1991 | Prioste et al. | |
| 5,281,151 A | 1/1994 | Arima et al. | |
| 5,438,166 A * | 8/1995 | Carey et al. ................. | 174/261 |
| 5,451,721 A | 9/1995 | Tsukada et al. | |
| 5,544,018 A | 8/1996 | Sommerfeldt et al. | |
| 5,633,479 A * | 5/1997 | Hirano ........................ | 174/255 |
| 5,686,764 A | 11/1997 | Fulcher | |
| 5,784,262 A | 7/1998 | Sherman | |
| 5,847,936 A | 12/1998 | Forehand et al. | |
| 6,181,004 B1 | 1/2001 | Koontz et al. | |
| 6,194,668 B1 | 2/2001 | Horiuchi et al. | |
| 6,198,635 B1 | 3/2001 | Shenoy et al. | |
| 6,232,564 B1 | 5/2001 | Arndt et al. | |
| 6,256,769 B1 | 7/2001 | Tamarkin et al. | |
| 6,271,478 B1 | 8/2001 | Horiuchi et al. | |
| 6,310,398 B1 | 10/2001 | Katz | |
| 6,335,493 B1 | 1/2002 | Horiuchi et al. | |
| 6,388,890 B1 | 5/2002 | Kwong et al. | |
| 6,407,343 B1 | 6/2002 | Tanaka | |

| | | |
|---|---|---|
| 6,452,262 B1 | 9/2002 | Juneja |
| 6,521,846 B1 | 2/2003 | Freda et al. |
| 6,545,876 B1 | 4/2003 | Kwong et al. |
| 2003/0043560 A1 | 3/2003 | Clarkson et al. |

FOREIGN PATENT DOCUMENTS

| | | |
|---|---|---|
| EP | 1 087 440 A2 | 3/2001 |
| FR | 2 782 230 | 2/2000 |
| JP | H05-54103 | 3/1993 |
| JP | H07-141409 | 6/1995 |
| JP | H10-134098 | 5/1998 |
| JP | H11-297885 | 10/1999 |
| JP | 2001-34643 | 2/2001 |
| JP | 2001-274288 | 10/2001 |
| JP | 2001-351983 | 12/2001 |

OTHER PUBLICATIONS

EP Search Report dated Jun. 22, 2004 for Application No. 03394085.9 (abstract).

EP Search Report dated Jun. 22, 2004 for Application No. 03394086.7 (abstract).

EP Search Report dated Jun. 22, 2004 for Application No. 03394028.9 (abstract).

\* cited by examiner

*Primary Examiner*—Rick K Chang
(74) *Attorney, Agent, or Firm*—Hunton & Williams LLP (57) ABSTRACT

Techniques for reducing the number of layers in a multilayer signal routing device are disclosed. The technique may be realized as a method for routing one or more conductive traces between a plurality of electronic components of a multilayer signal routing device. The method comprises forming a first inter-component channel at a first routing layer of the multilayer signal routing device, the first inter-component channel extending between a first set of two or more electronic components of the plurality of electronic components and having a first orientation and forming a second inter-component channel at a second routing layer of the multilayer signal routing device, the second inter-component channel extending between a second set of two or more electronic components of the plurality of electronic components and having a second orientation different from the first orientation.

14 Claims, 7 Drawing Sheets

TECHNIQUE FOR ROUTING CONDUCTIVE TRACES BETWEEN A PLURALITY OF ELECTRONIC COMPONENTS OF A MULTILAYER SIGNAL ROUTING DEVICE

CROSS-REFERENCE TO RELATED APPLICATIONS

This patent application is a continuation-in-part patent application of U.S. patent application Ser. No. 10/101,211, filed Mar. 20, 2002, which is a continuation-in-part patent application of U.S. patent application Ser. No. 09/651,188, filed Aug. 30, 2000, now U.S. Pat. No. 6,388,890, which claims priority to U.S. Provisional Patent Application No. 60/212,387, filed Jun. 19, 2000, all of which are hereby incorporated by reference herein in their entirety.

This patent application is also a continuation-in-part patent application of U.S. patent application Ser. No. 10/326,123, filed Dec. 23, 2002 now U.S. Pat. No. 7,069,650, which is a continuation-in-part patent application of the above-referenced U.S. patent application Ser. No. 10/101,211, filed Mar. 20, 2002, and a continuation-in-part patent application of U.S. patent application Ser. No. 10/126,700, filed Apr. 22, 2002, now U.S. Pat. No. 6,545,876, which is a continuation of the above-referenced U.S. patent application Ser. No. 09/651,188, filed Aug. 30, 2000, now U.S. Pat. No. 6,388,890, all of which are hereby incorporated by reference herein in their entirety.

This patent application is also a continuation-in-part patent application of U.S. patent application Ser. No. 10/326,079, filed Dec. 23, 2002, which is a continuation-in-part patent application of the above-referenced U.S. patent application Ser. No. 10/126,700, filed Apr. 22, 2002, now U.S. Pat. No. 6,545,876, and a continuation-in-part patent application of the above-referenced U.S. patent application Ser. No. 10/101,211, filed Mar. 20, 2002, all of which are hereby incorporated by reference herein in their entirety.

This patent application is also a continuation-in-part patent application of U.S. patent application Ser. No. 10/407,460, filed Apr. 7, 2003 now U.S. Pat. No. 7,069,646, which is a continuation-in-part patent application of the above-referenced U.S. patent application Ser. No. 10/126,700, U.S. Pat. No. 6,545,876, a continuation-in-part application of the above-referenced U.S. patent application Ser. No. 10/101,211, filed Mar. 20, 2002, a continuation-in-part patent application of the above-referenced U.S. patent application Ser. No. 10/326,123, filed Dec. 23, 2002 now U.S. Pat. No. 7,069,650, and a continuation-in-part patent application of U.S. patent application Ser. No. 10/326,079, filed Dec. 23, 2002, all of which are hereby incorporated by reference herein in their entirety.

FIELD OF THE INVENTION

The present invention relates generally to multilayer signal routing devices and, more particularly, to techniques for improved channel routing in multilayer signal routing devices having a matrix of electronic components.

BACKGROUND OF THE INVENTION

The making of electrical connections between electronic components has long been accomplished using printed circuit boards (PCBs). The first such circuit boards had only a single routing layer on a top surface thereof for routing electrical signals between electronic components mounted thereon. These single routing layer circuit boards have severe limitations with regard to the number of electrical signals that can be routed between electronic components mounted on the same circuit board. That is, the number of electrical signals that can be routed between electronic components mounted on a single routing layer circuit board is limited by the amount of area on the single routing layer.

The area limitations associated with single routing layer circuit boards led to the development of multilayer PCBs. Such multilayer PCBs may be either single or double-sided and may have multiple routing layers on the surface of and buried within the multilayer PCBs. Thus, such multilayer PCBs have allowed a large increase in the number of electrical signals that may be routed between electronic components mounted on the same circuit board.

The use of multilayer PCBs has been particularly beneficial when using electronic components having high-density packages. That is, electronic components having high-density packages generally require multiple layers of a multilayer PCB to make electrical connections with other electronic components mounted on the same circuit board. In fact, the density of electronic components (more specifically, the density of input/output contacts) typically dictates the number of layers that must be provided by the multilayer PCB upon which the electronic components are mounted. While the number of layers that may be provided by a multilayer PCB is theoretically unlimited, PCB reliability and signal integrity issues result when the number of layers in a multilayer PCB increases the PCB to an undesirable thickness. For example, when making electrical connections between different layers in multilayer PCBs, electrically conductive vias are generally used. While these electrically conductive vias allow direct vertical electrical connections to be made between different layers within a multilayer PCB, there are intrinsic parasitics associated with these electrically conductive vias that can adversely affect the performance of signals propagating therethrough. That is, these electrically conductive vias have intrinsic parasitic resistance, capacitance, and inductance, which can adversely affect signals propagating along each electrically conductive via. In addition, these intrinsic parasitics can also have an adverse effect on the manufacturability of a PCB and thus the cost thereof. Because of their adverse affect on signal performance, these intrinsic parasitics can also limit the bandwidth of signals propagating along each electrically conductive via. These adverse affects only increase as the number of layers in a multilayer PCB increase.

In recognition of the increase in adverse effects on signal integrity as the layer count of a PCB increases, techniques have been developed to provide for "channel routing" within a PCB to reduce the number of layers necessary to provide the requisite electrical connections. An exemplary channel routing technique is described in above-referenced U.S. Pat. No. 6,388,890 issued on May 14, 2002, to Kwong et al., the entirety of which is incorporated by reference herein. Kwong et al. disclose a technique for manufacturing and using a PCB wherein certain vias connecting an electronic component to the PCB extend only through a subset of the layers of the PCB to create channels in the portions of the PCB where vias are absent. These channels then may be used to route a larger number of signal, power, ground and/or test traces between vias thereby reducing the number of layers necessary to provide a certain number of electrical connections for an electronic component.

As the complexity of electronic systems increases, multiple electronic components typically are placed closer together on the surface of a multilayer signal routing device.

As a result, as the space between electronic components shrinks, it becomes more difficult to route conductive traces between electronic components (i.e., inter-component conductive traces) from one region of the multilayer signal routing device to another.

In view of the foregoing, it would be desirable to provide a technique for interconnecting multiple electronic components of a multilayer signal routing device that overcomes the above-described inadequacies and shortcomings.

SUMMARY OF THE INVENTION

According to the present invention, a technique for improved signal routing in a multilayer signal routing device having a plurality of electronic components are provided. In one embodiment, the technique may be realized as a method for routing one or more conductive traces between a plurality of electronic components of a multilayer signal routing device. The method comprises forming a first inter-component channel at a first routing layer of the multilayer signal routing device, the first inter-component channel extending between a first set of two or more electronic components of the plurality of electronic components and having a first orientation and forming a second inter-component channel at a second routing layer of the multilayer signal routing device, the second inter-component channel extending between a second set of two or more electronic components of the plurality of electronic components and having a second orientation different from the first orientation. The method may further comprise routing at least one conductive trace between at least one electronic component of the first set of electronic components and at least one electronic component of the second set of electronic components via at least a portion of the first inter-component channel and at least a portion of the second inter-component channel.

In another embodiment, the technique may be realized as a method for routing one or more conductive traces between a plurality of electronic components of a multilayer signal routing device. The method comprises forming a first set of one or more inter-component channels at a first set of one or more routing layers of the multilayer signal routing device, wherein each inter-component channel of the first set of inter-component channels extends between at least two of the plurality of electronic components and has an orientation substantially parallel to a first orientation, forming a second set of one or more inter-component channels at a second set of one or more routing layers of the multilayer signal routing device, wherein each inter-component channel of the second set of inter-component channels extends between at least two of the plurality of electronic components and has an orientation substantially parallel to a second orientation different from the first orientation, and routing at least one conductive trace from at least one electronic component to at least one other electronic component via at least one portion of one or more inter-component channels of the first and second sets of inter-component channels.

In yet another embodiment, the technique may be realized as a multilayer signal routing device having a plurality of routing layers. The multilayer signal routing device comprises a plurality of electronic components, a first set of one or more inter-component channels at a first set of one or more routing layers of the multilayer signal routing device, wherein each inter-component channel of the first set of inter-component channels extends between at least two of the plurality of electronic components and has an orientation substantially parallel to a first orientation and a second set of one or more inter-component channels at a second set of one or more routing layers of the multilayer signal routing device, wherein each inter-component channel of the second set of inter-component channels extends between at least two of the plurality of electronic components and has an orientation substantially parallel to a second orientation different from the first orientation. The multilayer signal routing device further comprises at least one conductive trace routed from at least one electronic component to at least one other electronic component via at least one portion of one or more inter-component channels of the first and second sets of inter-component channels. The multilayer signal routing device further may comprise one or more conductive paths formed between one or more inter-component channels of the first set of inter-component channels and one or more inter-component channels of the second set of inter-component channels.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a more full understanding of the present invention, reference is now made to the appended drawings. These drawings should not be construed as limiting the present invention, but are intended to be exemplary only.

DETAILED DESCRIPTION OF EXEMPLARY EMBODIMENT(S)

At the outset, it is helpful to refer to the microvia-based techniques for reducing the number of layers in a multilayer signal routing device and the power/ground-based techniques for reducing the number of layers in a multilayer signal routing device as have been substantially described in the above-referenced U.S. Provisional Patent Application No. 60/212,387, the above-referenced U.S. patent application Ser. No. 09/651,188, now U.S. Pat. No. 6,388,890, the above-referenced U.S. patent application Ser. No. 10/101, 211, the above-referenced U.S. patent application Ser. No. 10/126,700, now U.S. Pat. No. 6,545,876, the above-referenced U.S. patent application Ser. No. 10/326,123, the above-referenced U.S. patent application Ser. No. 10/326, 079, and the above-referenced U.S. patent application Ser. No. 10/407,460, all of which have been incorporated by reference herein in their entirety.

The above-referenced microvia-based and power/ground-based techniques are certainly beneficial for reducing the number of layers in a multilayer signal routing device. However, these techniques may be even more beneficial if used in conjunction with one or more of the techniques described herein. It should be noted, however, that the techniques described herein may also be used separately to reduce the number of layers in a multilayer signal routing device in an efficient and cost effective manner.

Figure 1A:
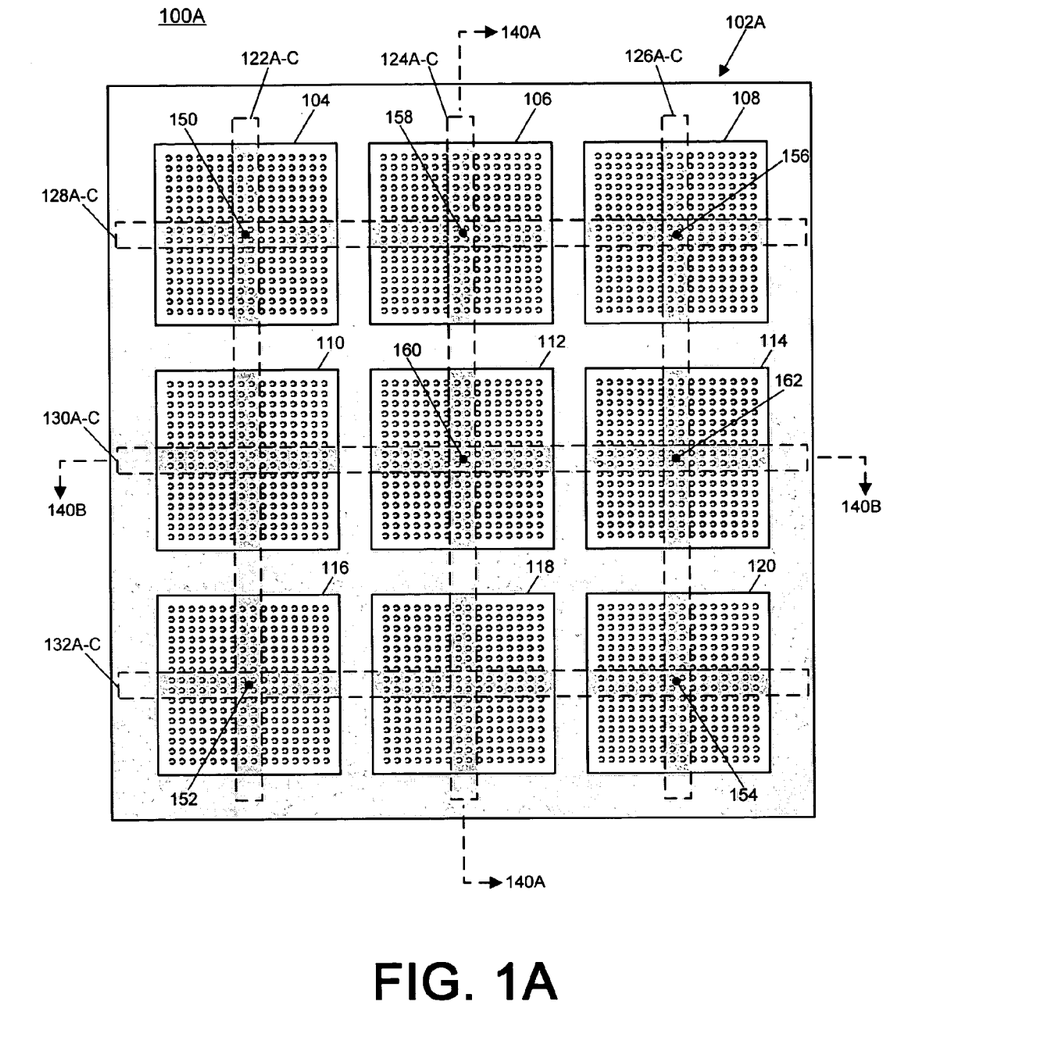
FIG. 1A is a top view of an exemplary multilayer signal routing device having inter-component channels for routing conductive traces between a plurality of electronic components in accordance with at least one embodiment of the present invention.

Referring now to FIGS. 1A-3, an exemplary technique for improved signal routing using channels that span multiple electronic components is illustrated. In the example of FIG. 1A, a top-view 100A of a multilayer signal routing device 102A is illustrated in accordance with at least one embodiment of the present invention. The multilayer signal routing device 102A includes alternating dielectric layers and routing layers so as to form a multilayer substrate, such as a printed circuit board (PCB) or printed wiring board (PWB).

Positioned on the surface of the multilayer signal routing device 102A is a plurality of electronic components 104-120. The electronic components 104-120 may include any of a variety of electronic components, such as, for example, a column grid array device, a ball grid array device, a chip scale package, a ceramic column grid array, a plastic ball grid array, surface mount array connector, surface mount array socket, etc.

In the illustrated example, the electronic components 104-120 are arranged in a tightly spaced 3×3 component matrix so as to conserve the surface area of the multilayer signal routing device 102A. However, by placing the electronic components 104-120 in close proximity to each other, it may be difficult or impossible to effectively route conductive traces from one electronic component to another, as discussed above. Accordingly, in at least one embodiment, one or more inter-component routing or escape channels (e.g., inter-component channels 122A-C, 124A-C, 126A-C, 128A-C, 130A-C and 132A-C) may be formed at various sub-surface routing layers of the multilayer signal routing device 102A to allow for effective signal routing from one electronic component to another.

The inter-component channels may be formed in a manner similar to the techniques described in the above-referenced patent applications whereby certain vias extend only through a subset of the layers of the multilayer signal routing device 102A and are arranged to create channels in the portions of the multilayer signal routing device 102A where vias are absent. In the present invention, the vias connecting the contacts of the electronic components 104-120 may be arranged to form channels that extend between multiple electronic components. These inter-component channels then may be used to route a number of signal, power, ground and/or test traces between electronic components, thereby reducing conductive trace congestion around the electronic components 104-120 as well as reducing the number of layers necessary to provide a certain number of electrical connections.

Further, the channel routing techniques described in the above-referenced patent applications ("the intra-component channel routing techniques") may be used in conjunction with the techniques of the present invention ("the inter-component channel routing techniques"). To illustrate, it may be advantageous to use the intra-component channel routing techniques to form channels under one or more electronic components for intra-component signal routing and additionally form inter-component channels using the techniques described herein for routing conductive traces between electronic components. As such, the intra-component channels may be thought of as analogous to local roads built for directing traffic flow in a local area, whereas inter-component channels are analogous to the interstate highways that are used to direct traffic flow between localities or as service roads alongside highways to route interstate traffic.

Figure 1B:
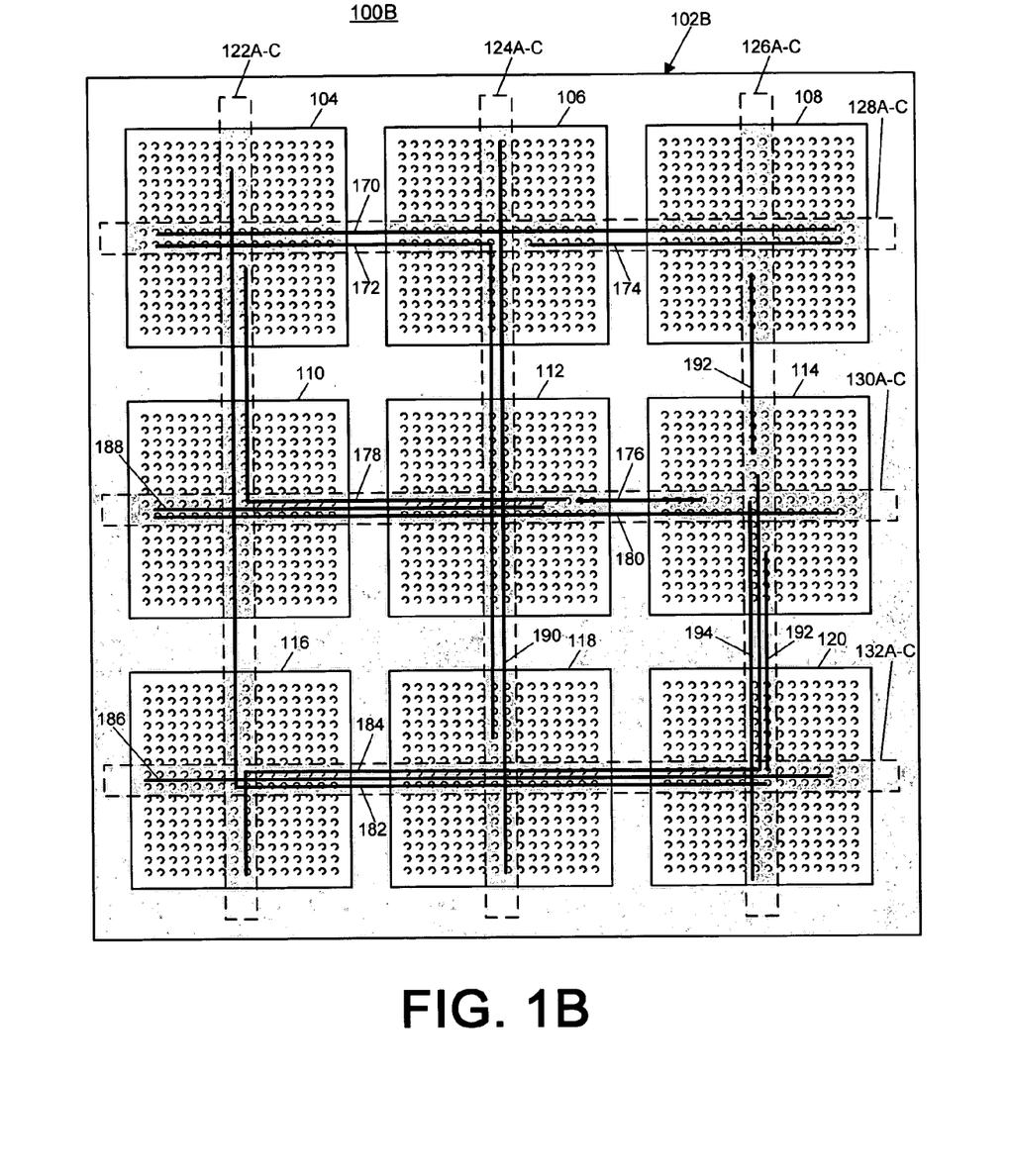
FIG. 1B is a top view of the exemplary multilayer signal routing device of FIG. 1A wherein a plurality of conductive traces are routed via portions of the inter-component channels in accordance with at least one embodiment of the present invention.

Referring to FIG. 1B, a top view 100B of an exemplary multilayer signal routing device 102B (analogous to multilayer signal routing device 102A) having inter-component conductive traces 170-194 routed between one or more electronic components 104-120 via one or more portions of one or more of the inter-component channels 122A-C, 124A-C, 126A-C, 128A-C, 130A-C and 132A-C is illustrated. As FIG. 1B shows, the inter-component channels may be used to route conductive traces between components in the same row (e.g., conductive trace 174 routed between electronic components 106 and 108 via one of inter-component channels 128A-C), between components in the same column (e.g., conductive trace 190 routed between electronic components 106, 112 and 118 via one of inter-component channels 124A-C) or between components on different rows and columns of the component matrix (e.g., conductive trace 182 routed between components 104, 110, 116, 118 and 120 via portions of one or more of inter-component channels 122A-C and 132A-C).

Referring again to FIG. 1A, in at least one embodiment, the inter-component channels located at a certain layer of the multilayer signal routing device 102A have substantially parallel orientations (i.e., oriented in the same or similar direction) so that the inter-component channels of the certain layer may extend across multiple electronic components without interfering with other inter-component channels at the same layer. For example, the inter-component channels 122A-C, 124A-C and 126A-C, substantially parallel to each other, may be positioned at one or more layers of the multilayer signal routing device 102A, whereas the inter-component channels 128A-C, 130A-C and 132A-C, substantially parallel to each other, may be positioned at one or more other layers of the multilayer signal routing device 102A. As such, the inter-component channels may extend across a portion or the entire length of the matrix of electronic components 104-120 without interfering with or intersecting another inter-component channel.

For ease of reference, inter-component channels having an orientation similar to the orientation of inter-component channels 122A-C, 124A-C and 126A-C are referred to herein as "vertical" inter-component channels and those inter-component channels having an orientation similar to the orientation of inter-component channels 128A-C, 130A-C and 132A-C are referred to herein as "horizontal" inter-component channels. The designations of "vertical" or "horizontal" are used only to differentiate between the orientations of different sets of inter-component channels and are not intended to imply any particular relationship between the orientation of an inter-component channel and a fixed reference point such as, for example, the plane of the horizon.

Figure 2A:
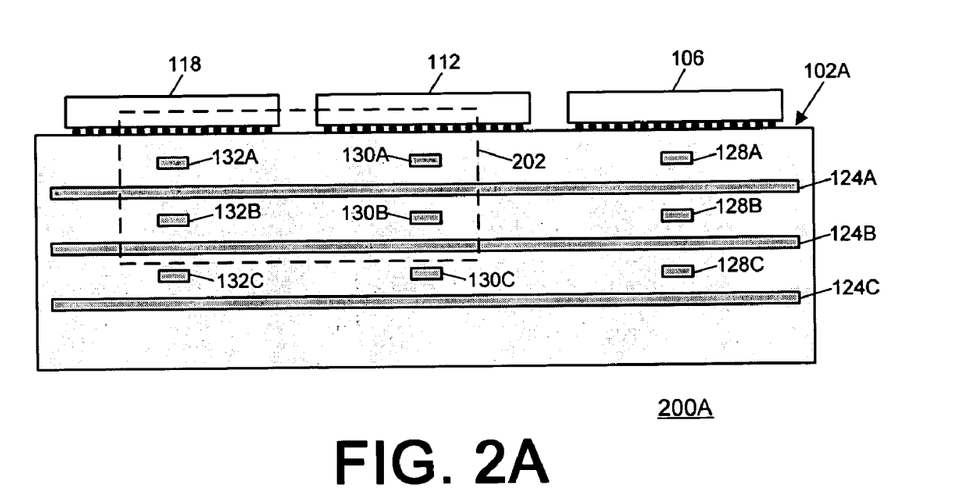
FIGS. 2A and 2B are side cross-section view of the exemplary multilayer signal routing device of FIG. 1A in accordance with at least one embodiment of the present invention.
Figure 2B:
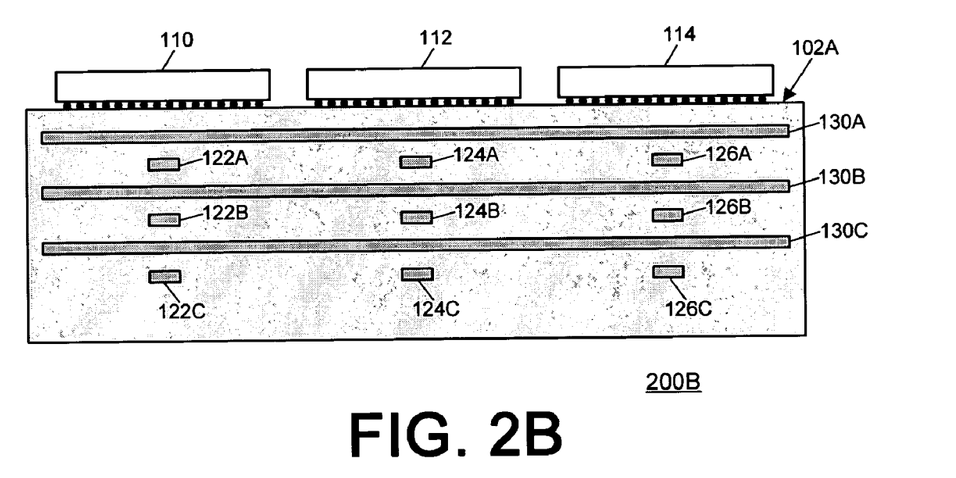

Referring now to FIGS. 2A and 2B, an exemplary side cross-sectional view 200A of the multilayer signal routing device 102A at cross-section line 140A (FIG. 1A) and an exemplary side cross-sectional view 200B of the multilayer signal routing device 102A at cross-section line 140B (at a right angle to cross-section line 140A)(FIG. 1A) are illustrated. As cross-section views 200A and 200B illustrate, the horizontal inter-component channels 128A, 130A and 132A may be located at a first layer of the multilayer signal routing device 102A, the vertical inter-component channels 122A, 124A and 126A may be located on a second layer of the multilayer signal routing device 102A, the horizontal inter-component channels 128B, 130B and 132B may be located at a third layer of the multilayer signal routing device 102A, the vertical inter-component channels 122B, 124B and 126B may be located on a fourth layer of the multilayer signal routing device 102A, the horizontal inter-component channels 128C, 130C and 132C may be located at a fifth layer of the multilayer signal routing device 102A, and the vertical inter-component channels 122C, 124C and 126C may be located on a sixth layer of the multilayer signal routing device 102A.

By grouping inter-component channels having the same or similar orientation by routing layer as illustrated in FIGS. 2A and 2B, a plurality of inter-component channels having different orientations may be implemented in the multilayer signal routing device 102A to provide signal routing channels between electronic components. To illustrate, a number of different routing paths may be used to route a conductive trace from a contact of electronic component 104 to electronic component 120 using the inter-component channels. For example, referring to FIG. 1A and FIGS. 2A and 2B, a conductive trace from the electronic component 104 to the electronic component 120 could be routed via the portion of inter-component channel 122A between point 150 and point 152 and via the portion of inter-component channel 132A between point 152 and point 154. In another example, the conductive trace could be routed via the portion of inter-component channel 128C from point 150 to point 156 and via the portion of inter-component channel 126B from point 156 to point 154. In yet another example, the conductive trace could be routed via the portion of inter-component channel 128C from point 150 to point 158, via the portion of inter-component channel 124 from point 158 to point 160, via the portion of inter-component channel 130B from point 160 to point 162 and via the portion of inter-component channel 126A from point 162 to point 154.

As the above signal routing examples demonstrate, portions of two or more inter-component channels typically are used to route a conductive trace between the electronic components unless two electronic components to be interconnected by a conductive trace are aligned along the same inter-component channel.

Figure 3:
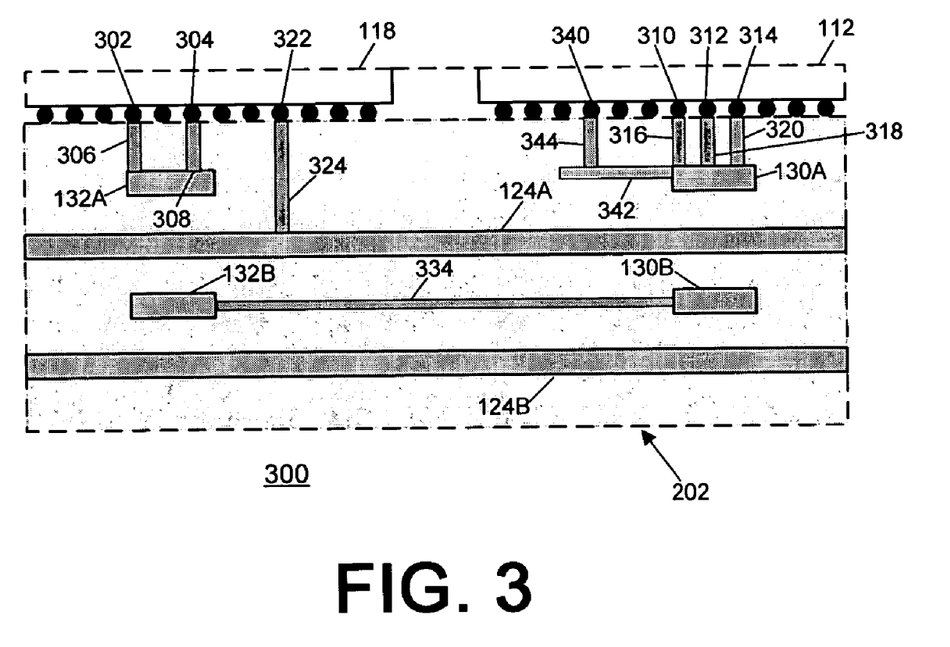
FIG. 3 is an enlarged cross-section view of a portion of the cross-section view of FIG. 2A showing various exemplary techniques for providing a conductive path between inter-component channels and between an electronic component and a inter-component channel in accordance with at least one embodiment of the present invention.

Referring now to FIG. 3, exemplary techniques for connecting inter-component channels are illustrated. FIG. 3 depicts an enlarged cross-section view 300 of cross-section portion 202 of FIG. 2A. The cross-section portion 202 includes a cross-section view of electronic components 112, 118 and inter-component channels 124A, 124B, 130A, 130B, 132A and 132B.

Any of a variety of techniques may be used to interconnect inter-component channels, including, for example, vias, microvias, through holes, blind vias, and the like. The particular routing strategy may be selected based on a number of factors, including signal integrity, interconnect density and component placement. To illustrate, to provide a conductive path between contacts 302, 304 of the electronic component 118 and the portion of the inter-component channel 132A beneath the electronic component 118, one or more microvias 306, 308 may be formed between the contacts 302, 304 and the inter-component channel 132A. Similarly, conductive traces between contacts 310-314 of electronic component 112 and inter-component channel 130A may be routed through microvias 316-320 formed between the contacts 310-314 and the portion of the inter-component channel 130A beneath the contacts 310-314.

In another example, conductive trace(s) between contact 322 of electronic component 118 and the inter-component channel 124A may be routed through a microvia 324 formed between contact 322 and the portion of the inter-component channel 124A beneath the contact 322, where the microvia 324 extends from the first routing layer having inter-component channels 128A-132A to the second routing layer where the inter-component channel 124A is located.

To connect inter-component channels located at the same routing layer, one or more conductive traces may be formed between the inter-component channels at the routing layer. For example, to connect inter-component channel 130B to inter-component channel 132B, a conductive trace 334 may be formed between the inter-component channels 130B, 132B at the third routing layer.

Additionally, in at least one embodiment, conductive traces may be routed to and between inter-component channels using intra-component channels formed using, for example, the channel routing techniques disclosed by Kwong, et al. To illustrate, to provide a conductive path between contact 340 of electronic component 112 and the inter-component channel 130A, an intra-component channel 342 may be formed beneath the contact 340 and intersecting the inter-component channel 130A. A conductive path may be formed between the contact 340 and the intra-component channel 342 using, for example, a microvia 344.

It will be appreciated that the ability to connect inter-component channels using vias, through holes, microvias, blind vias, or same-routing-layer conductive traces typically is limited by the presence of other features between the inter-component channels. For example, the presence of conductive trace 334 at cross-section line 140A typically would prevent the formation of a blind via between the inter-component channels 130B, 132B at the cross-section line 140A for the purpose of connecting inter-component channels 124A, 124B. Likewise, the presence of the inter-component channel 132A prevents the formation of a microvia between the contact 304 and the inter-component channel 124A.

Figure 4:
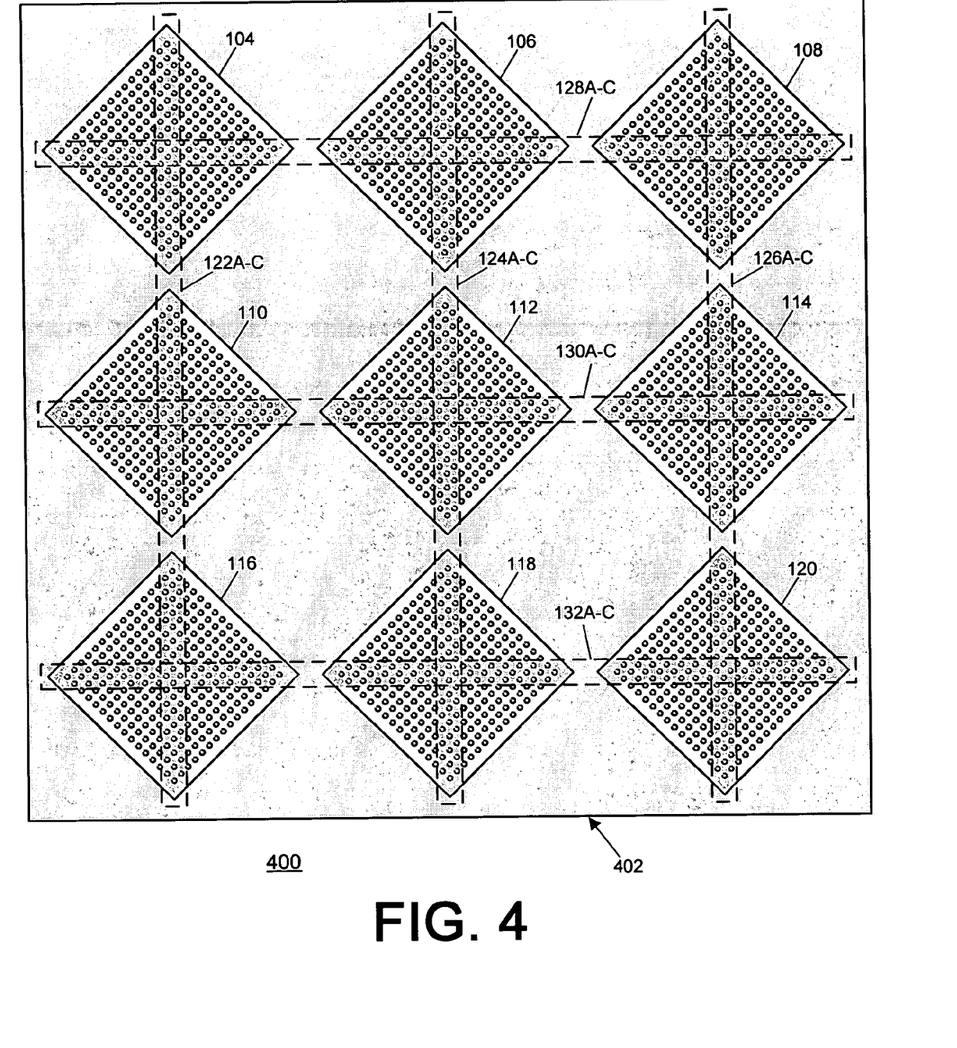
FIGS. 4 and 5 are top views of multilayer signal routing devices having various exemplary electronic component arrangements and exemplary inter-component channel arrangements in accordance with at least one embodiment of the present invention.

Accordingly, the electronic components 104-120 and the inter-component channels of a multilayer signal routing device preferably are arranged to facilitate the efficient routing of inter-component conductive traces. For example, FIG. 4 illustrates a top view 400 of an exemplary multilayer signal routing device 402 (analogous to multilayer signal routing device 102A) having electronic components 104-120 arranged so that the corners of the electronic components 104-120 are immediately adjacent to the corresponding corner of an adjacent electronic component. In this example, the inter-component channels 122A-122C, 124A-124C, 126A-126C, 128A-128C, 130A-130C and 132A-132C are formed so as to extend diagonally from corner to corner of the respective electronic components. In certain instances, such an arrangement may make inter-component signal routing easier because in certain instances, some electronic components have contacts arranged such that wider diagonal channels are easier or cheaper to form than horizontal and vertical channels. Further, diagonal channels may provide the shortest path, thereby facilitating high-speed signal traces.

Figure 5:
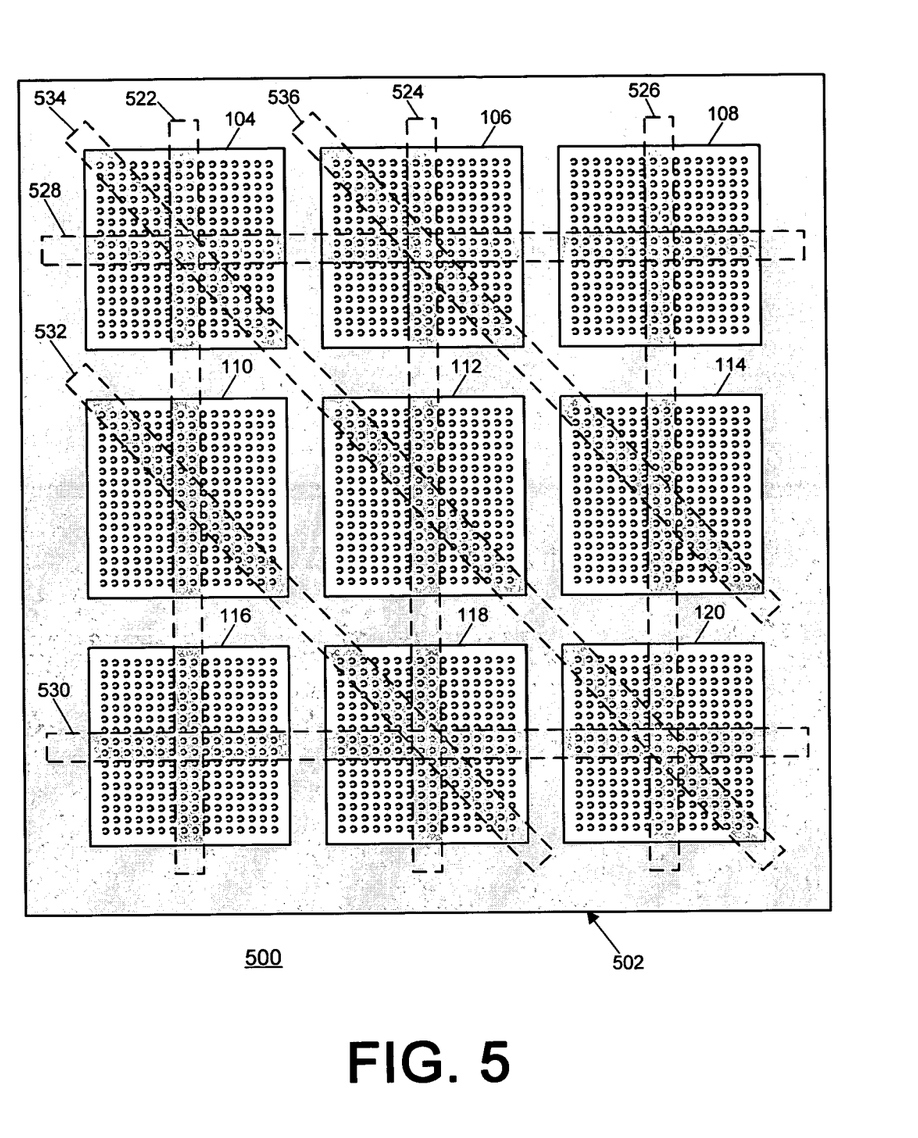

In another example, FIG. 5 illustrates a top view 500 of an exemplary multilayer signal routing device 502 (analogous to multilayer signal routing device 102A) having electronic components 104-120 arranged as illustrated in FIG. 1. In contrast to FIG. 4, rather than modifying the arrangement of the electronic components 104-120, inter-component channels formed at the layers of the multilayer signal routing device 502 may be arranged so as to provide efficient inter-component signal routing. For example, vertical inter-component channels 522-526 and horizontal inter-component channels 528, 530 may be formed consistent with the grid pattern illustrated in FIG. 1. Additionally, the multilayer signal routing device 502 may include inter-component channels 532-536 arranged to extend diagonally between two or more of the electronic components 104, 106, 110, 112, 114, 118 and 120.

Inter-component channel arrangements such as the exemplary arrangement illustrated in FIG. 5 may be configured to provide optimal signal routing options based on the particular inter-component signaling requirements for a multilayer signal routing device. To illustrate, the multilayer signal routing device 502 may be designed so that little or no signaling occurs between, for example, electronic component 116 and electronic components 106, 108, 112 and 114 or between electronic component 108 and electronic components 110, 112, 116 and 118, whereas considerable signaling occurs between electronic components 104, 106, 110, 112, 114, 118 and 120. Accordingly, the number of inter-component channels extending between the electronic components 108, 116 and their surrounding electronic components may be minimized while the number and/or arrangement of inter-component channels extending between electronic components 104, 106, 110, 112, 114, 118 and 120 may be optimized to provide the most direct routes between electronic components possible under the circumstances.

Additionally, in certain instances, inter-component channels having different orientations may be located at the same routing layer. For example, even though inter-component channels 526 and 532 have non-parallel orientations, they terminate before intersecting. Inter-component channels 526 and 532 therefore may be located on the same routing layer. Inter-component channels 530 and 536 could be located on the same routing layer for the same reason, as could inter-component channels 522 and 536 and inter-component channels 528 and 532.

As such, inter-component channels 526 and 532 may be considered to have substantially parallel orientations because the lengths and positions of the inter-component channels 526 and 532 are such that although their orientations are not parallel, they do not intersect at any point along their lengths.

Figure 6:
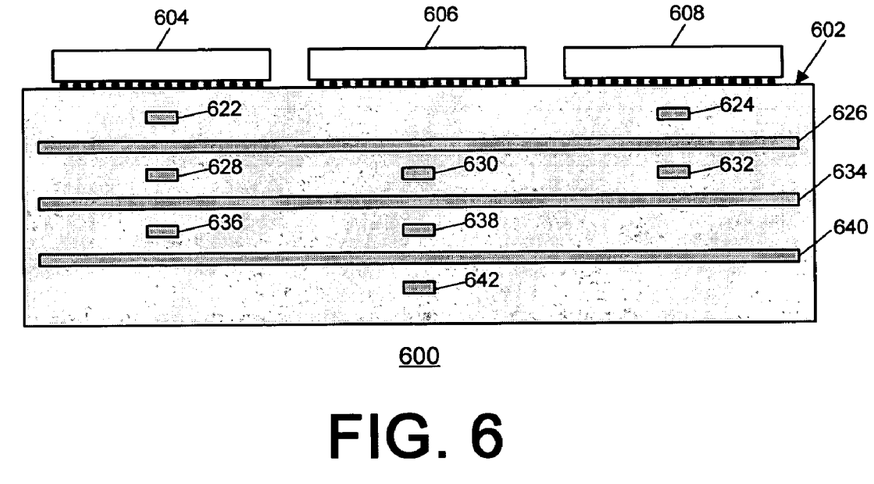
FIG. 6 is a side cross-section view of a multilayer signal routing device having an exemplary inter-component channel arrangement in accordance with at least one embodiment of the present invention.

Referring now to FIG. 6, a side cross-section view 600 of an exemplary multilayer signal routing device implementing inter-component channels is illustrated in accordance with at least one embodiment of the present invention.

Although FIGS. 2A and 2B illustrate one embodiment wherein each layer has a same number of inter-component channels, in other embodiments, it may be advantageous to implement more or fewer inter-component channels on some layers compared to other layers. For example, the cross-section view 600 shows a multilayer signal routing device 602 having electronic components 604-608 on the surface, inter-component channels 622 and 624 on at a first layer, inter-component channel 626 at a second layer, inter-component channels 628-632 at a third layer, inter-component channel 634 at a fourth layer, inter-component channels 636 and 638 at a fifth layer, inter-component channel 640 at a sixth layer, and inter-component channel 642 at a seventh layer.

The inter-component channels 622-642 may be arranged as shown or in a similar arrangement for any of a variety of reasons. For example, intra-component channel routing for electronic component 606 may preclude the use of one or more layers directly beneath the electronic component 606 for forming one or more inter-component channels.

Similarly, inter-component channels on different routing layers and having a same or similar orientation are not necessarily positioned directly above or beneath one another. Moreover, in some instances, it may be advantageous to extend an inter-component channel only partially across a series of electronic components.

In at least one embodiment, a purpose of a particular arrangement of electronic components and/or inter-component channels is to minimize the number of routing layers needed to provide signaling between the electronic components arranged in some form of a matrix. Accordingly, an exemplary method for determining the number of routing layers necessary to implement a particular arrangement is provided below.

Assuming each electronic component of an M electronic component by N electronic component matrix (i.e., an M×N component matrix) has a contact array of A contacts by B contacts (i.e., a A×B contact array) and assuming that $C_v$ represents the number of intra-component channels created vertically and $C_h$ represents the number of intra-component channels created horizontally, the total number of vertical channels available top to bottom, denoted $C_{v\_total}$ is:

$$C_{v\_total} = 2(B \times N) + 2C_v \qquad \text{EQ. 1}$$

and the total number of horizontal channels available side to side, denoted $C_{h\_total}$ is:

$$C_{h\_total} = 2(A \times M) + 2C_h \qquad \text{EQ. 2}$$

Assuming an extreme scenario where all of the contacts need to be routed out, the total number of routing layers, denoted $L_{total}$ is:

$$L_{total} = \frac{(N \times M) \times (A \times B)}{C_{v\_total} + C_{h\_total}} \qquad \text{EQ. 3}$$

Using the above calculations, a circuit designer may estimate the total number of routing layers to implement at least one embodiment of the intra-component routing technique described herein.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

The invention claimed is:

1. A method for routing one or more conductive traces between a plurality of electronic components of a multilayer signal routing device, the method comprising:

forming a first inter-component channel for accommodating a plurality of conductive traces at a first routing layer of the multilayer signal routing device, the first inter-component channel extending between a first set of two or more electronic components of the plurality of electronic components and having a first orientation, the first inter-component channel formed by arranging vias for at least the first set of two or more electronic components in the multilayer signal routing device; and forming a second inter-component channel for accommodating a plurality of conductive traces by arranging vias at a second routing layer of the multilayer signal routing device, the second inter-component channel extending between a second set of two or more electronic components of the plurality of electronic components and having a second orientation different from the first orientation, the second inter-component channel formed by arranging vias for at least the second set of two or more electronic components in the multilayer signal routing device.

2. The method as in claim 1, further comprising the step of routing at least one conductive trace between at least one electronic component of the first set of electronic components and at least one electronic component of the second set of electronic components via at least a portion of the first inter-component channel and at least a portion of the second inter-component channel.

3. The method as in claim 2, further comprising the step of forming a conductive path between the first inter-component channel at the first routing layer and the second inter-component channel at the second routing layer.

4. The method as in claim 3, wherein the conductive path includes a blind via or a microvia.

5. The method as in claim 1, further comprising the step of forming a third inter-component channel for accommodating a plurality of conductive traces at a routing layer of the multilayer signal routing device, the third inter-component channel extending between a third set of two or more electronic components of the plurality of electronic components and having a third orientation substantially parallel to the first orientation, the third inter-component channel formed by arranging vias for at least the third set of two or more electronic components in the multilayer signal routing device.

6. The method as in claim 5, further comprising the step of routing at least one conductive trace between at least one electronic component of the first set of electronic components and at least one electronic component of the third set of electronic components via at least a portion of the first inter-component channel, at least a portion of the second inter-component channel and at least a portion of the third inter-component channel.

7. The method as in claim 5, wherein the third inter-component channel is formed at the first routing layer of the multilayer signal routing device.

8. The method as in claim 5, wherein the third inter-component channel is formed at a third routing layer of the multilayer signal routing device.

9. The method as in claim 1, further comprising the step of forming one or more conductive paths between one or more of the electronic components and one or more of the first and second inter-component channels.

10. A method for routing one or more conductive traces between a plurality of electronic components of a multilayer signal routing device, the method comprising:

forming a first set of one or more inter-component channels each for accommodating a plurality of conductive traces at a first set of one or more routing layers of the multilayer signal routing device, wherein each inter-component channel of the first set of inter-component channels extends between at least two of the plurality of electronic components and has an orientation substantially parallel to a first orientation, the first set of inter-component channels formed by arranging vias for at least the two electronic components in the multilayer signal routing device;

forming a second set of one or more inter-component channels each for accommodating a plurality of conductive traces at a second set of one or more routing layers of the multilayer signal routing device, wherein each inter-component channel of the second set of inter-component channels extends between at least two of the plurality of electronic components and has an orientation substantially parallel to a second orientation different from the first orientation, the second set of inter-component channels formed by arranging vias for at least the two electronic components in the multilayer signal routing device; and routing at least one conductive trace from at least one electronic component to at least one other electronic component via at least one portion of one or more inter-component channels of the first and second sets of inter-component channels.

11. The method as in claim 10, further comprising the step of forming one or more conductive paths between one or more inter-component channels of the first set of inter-component channels and one or more inter-component channels of the second set of inter-component channels.

12. The method as in claim 10, wherein a number of routing layers of the first set of routing layers is based at least in part on a number of conductive traces at least partially routed in a direction substantially parallel to the first orientation and a number of inter-component channels formed at each routing layer of the first set of routing layers.

13. The method as in claim 12, wherein a number of routing layers of the second set of routing layers is based at least in part on a number of conductive traces at least partially routed in a direction substantially parallel to the second orientation and a number of inter-component channels formed at each routing layer of the second set of routing layers.

14. The method of claim 10, further comprising the steps of:

forming a third set of one or more inter-component channels each for accommodating a plurality of conductive traces at a third set of one or more routing layers of the multilayer signal routing device, wherein each inter-component channel of the third set of inter-component channels extends between at least two of the plurality of electronic components and has a third orientation different from the first and second orientations, the third set of inter-component channels formed by arranging vias for at least the two electronic components in the multilayer signal routing device; and routing at least one conductive trace from at least one electronic component to at least one other electronic component via at least one portion of one or more inter-component channels of the first, second and third sets of inter-component channels.

\* \* \* \* \*